United States Patent
Lu et al.

(10) Patent No.: US 7,952,353 B2
(45) Date of Patent: May 31, 2011

(54) METHOD AND APPARATUS FOR FIELD MAP ESTIMATION

(75) Inventors: Wenmiao Lu, Nanyang Heights (SG); Yi Lu, Palo Alto, CA (US)

(73) Assignee: The Board of Trustees of The Leland Stanford Junior University, Palo Alto, CA (US)

( * ) Notice: Subject to any disclaimer, the term of this patent is extended or adjusted under 35 U.S.C. 154(b) by 196 days.

(21) Appl. No.: 12/436,689

(22) Filed: May 6, 2009

(65) Prior Publication Data

US 2010/0283463 A1   Nov. 11, 2010

(51) Int. Cl.
*G01V 3/00* (2006.01)
(52) U.S. Cl. .................................. 324/307; 324/309
(58) Field of Classification Search .................. 324/307, 324/309

See application file for complete search history.

(56) References Cited

U.S. PATENT DOCUMENTS

| | | | |
|---|---|---|---|
| 5,485,085 A | 1/1996 | Sumanaweera et al. | |
| 5,751,145 A | 5/1998 | Shimizu | |
| 5,909,119 A | 6/1999 | Zhang et al. | |
| 6,307,368 B1 | 10/2001 | Vasanawala et al. | |
| 6,459,922 B1 | 10/2002 | Zhang | |
| 6,703,835 B2 | 3/2004 | Patch et al. | |
| 6,856,134 B1 | 2/2005 | Reeder et al. | |
| 7,116,105 B1 * | 10/2006 | Zhang | 324/307 |
| 7,486,073 B2 * | 2/2009 | Yu et al. | 324/307 |
| 7,592,807 B2 * | 9/2009 | Pineda et al. | 324/307 |
| 7,741,842 B2 * | 6/2010 | McKenzie et al. | 324/307 |
| 2005/0033731 A1 * | 2/2005 | Lesh et al. | 707/2 |
| 2009/0174403 A1 * | 7/2009 | Lu | 324/307 |
| 2009/0195247 A1 * | 8/2009 | Pfeuffer et al. | 324/307 |

OTHER PUBLICATIONS

Lu et al. "Multiresolution Field Map Estimation Using Golden Section Search for Water-Fat Separation", Magnetic Resonance in Medicine, vol. 60, No. 1 pp. 236-244, 2008.
Lu et al. "JIGSAW: Joint Inhomogeneity Estimation via Global Segment Assembly for Water-Fat Separation", ISMRM, p. 871, Apr. 2009.

* cited by examiner

*Primary Examiner* — Louis M Arana
(74) *Attorney, Agent, or Firm* — Beyer Law Group LLP

(57) ABSTRACT

A method for estimating values of a field map to generate a magnetic resonance display image with species separation is provided. A set of MR images is acquired based on an applied magnetic resonance excitation. A set of feasible field map values for each pixel in a field map are determined from the set of MR images. Estimated values of the field map for each pixel are chosen from the set of feasible field map values using a combinatorial optimization algorithm that includes a smoothness constraint. The combinatorial optimization algorithm includes iteratively communicating, between neighboring pixels in the field map, sum-product belief messages that include likelihoods for feasible field map values. Field map values are fixed to most likely field map values if the pixel satisfies the smoothness constraint with its neighboring pixels. A magnetic resonance display image with species separation is generated using the estimated field map.

20 Claims, 9 Drawing Sheets

METHOD AND APPARATUS FOR FIELD MAP ESTIMATION

GOVERNMENT RIGHTS

This invention was made with Government support under contracts NIH-EB002524-01, NIH-RR009784-11, and NIH-HL075803-01 awarded by the National Institutes of Health. The Government has certain rights in this invention.

BACKGROUND OF THE INVENTION

This invention relates generally to magnetic resonance imaging (MRI), and more particularly, the invention relates to field map estimation from multi-echo MRI sequences.

Magnetic resonance imaging (MRI) is a non-invasive method for the analysis of materials and is an approach to medical imaging. It does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Reliable and uniform fat suppression in MRI is clinically important, as fat signals appear bright in many fast imaging sequences, such as fast spin echo, spoiled gradient echo, and balanced SSFP. Unless suppressed, bright fat signals may obscure underlying pathology, degrading the diagnostic value of MR images. Common fat suppression techniques include fat saturation, spectral-spatial water selective excitation, STIR (short-tau inversion recovery), and water-fat separation methods based on chemical-shift induced phase differences. The latter group of methods, derived from the two-point Dixon method, is less susceptible to magnetic field ($B_0$) inhomogeneities, since field inhomogeneities can be corrected before separation. The potential to correct for field inhomogeneities has led to many variations of multi-point water-fat separation methods.

SUMMARY OF THE INVENTION

In accordance with the invention, a method for estimating values of a field map to generate a magnetic resonance display image with species separation is provided. A magnetic resonance excitation is applied. A set of MR images at multiple echo times based on the magnetic resonance excitation is acquired. A set of feasible field map values for each pixel in a field map is determined from the set of MR images. Estimated values of the field map for each pixel are chosen from the set of feasible field map values using a combinatorial optimization algorithm that includes a smoothness constraint. A magnetic resonance display image with species separation is generated using the estimated field map.

In an embodiment of the invention, the method for estimating values of a field map includes determining a set of feasible field map values for a pixel in the field map by calculating a least squares residue cost function for the pixel, locating local minima of the cost function across a range of field inhomogeneity values, and choosing the set of feasible field map values for the pixel from the cost function's local minima. For each pixel, a most likely field map value is chosen from the set of feasible field map values based on a belief vector calculated using a set of sum-product belief messages received from one or more neighboring pixels. A sum-product belief message received from a neighboring pixel includes estimated likelihoods of one or more of the field map values in the set of feasible field map values for the pixel that receives the message. The belief vector includes overall likelihoods for each of the feasible field map values for the pixel based on the estimated likelihoods received from the neighboring pixels.

In an embodiment of the invention, the method for estimating values of a field map includes fixing a field map value for a pixel to a most likely field map value if the pixel satisfies a smoothness constraint with its neighboring pixels. In another embodiment of the invention, the method for estimating values of a field map includes fixing a field map value for a pixel to a value adjacent to a most likely field map value if the pixel does not satisfy a smoothness constraint with its neighboring pixels. In some embodiments of the invention, the smoothness constraint minimizes a number of inconsistent pairs of field map values for neighboring pixels in the field map.

In another embodiment of the invention, a magnetic imaging apparatus is provided. The magnetic resonance imaging system includes a controller, which is connected to a magnetic resonance imaging excitation and detection system, including a display, at least one processor and computer readable media. The computer readable media includes computer readable code for generating an estimated field map by applying a magnetic resonance excitation, acquiring a set of MR images at multiple echo times based on the magnetic resonance excitation, determining a set of feasible field map values for each pixel in a field map from the set of acquired MR images, and choosing a field map value for each pixel from the set of feasible field map values for that pixel using a combinatorial optimization algorithm that includes a smoothness constraint. The computer readable media also includes computer readable code for generating a magnetic resonance display image with species separation using the estimated field map.

DETAILED DESCRIPTION OF ILLUSTRATED EMBODIMENTS

Figure 1:
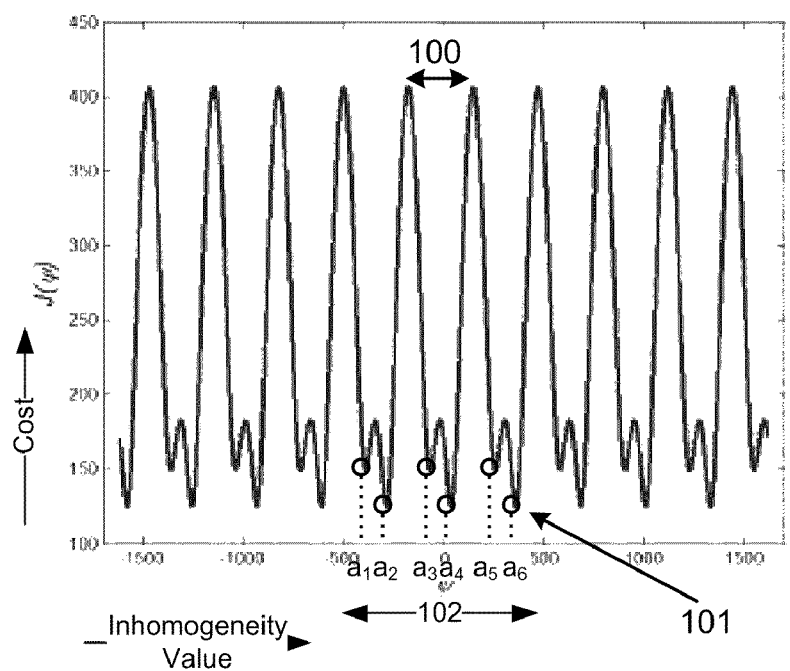
FIG. 1 illustrates an exemplary periodic cost function with minima across a range of feasible field map inhomogeneity values for a pixel.

Compared to fat suppression methods based on spectrally-selective excitation, water-fat separation methods based on chemical-shift induced phase (also referred to as phase-sensitive water-fat separation methods), such as the 3-point Dixon method described by G. H. Glover, "Multipoint Dixon Technique for Water and Fat Proton and Susceptibility Imaging," (J. Magn. Reson. Imaging., 1991, vol. 1, no. 5, pp. 521-530) and the IDEAL method described in U.S. Pat. No. 7,176,683 B2 and incorporated by reference herein, show better immunity to field inhomogeneities. Phase-sensitive water-fat separation estimates field inhomogeneities from multiple MR images acquired at different echo times, which is a simple case of spectroscopic imaging. The most common acquisition schemes fall into two categories, two-point and three-point acquisitions, according to the number of the acquired MR images. Three-point acquisition with flexible echo times has shown success in many clinical applications and held great promise in dealing with large field inhomogeneities.

The choice of echo times for phase-sensitive water-fat separation has been studied to achieve optimal signal-to-noise ratio (SNR) with the corresponding acquisition scheme. In contrast, little work is available on echo spacing, the difference between two consecutive echo times. The reciprocal of the echo spacing determines the spectral FOV within which the field inhomogeneities can be unambiguously resolved. When the spectral FOV is insufficient to accommodate field inhomogeneities, the resulting aliasing may impair the robustness of existing field map estimation techniques. Aliasing in a spectral FOV may arise in several clinically important scenarios, such as high-resolution imaging with multi-echo sequences, imaging at high field strengths and/or around anatomies where good shimming may not be achieved.

This invention describes a novel field map estimation technique called JIGSAW, Joint Inhomogeneities estimation via Global Segment Assembly for Water-fat separation. JIGSAW is based on belief propagation (BP) guided decimation used in statistical physics for combinatorial constraint satisfaction problems. By jointly determining field inhomogeneities with the BP algorithm, JIGSAW produces large segments of pixels within which field map values are consistent. The field map estimation problem may then be reduced to the assembly of a few large segments. We may assemble the large segments by jointly considering field map values on the segment boundaries. The belief-propagation approach of JIGSAW may naturally extend to 3D imaging, whereby the information from a completed 2D field map may be successively propagated to produce a 3D field map with little additional complexity.

Theory

Let $I_n$ denote an image acquired at the nth echo time, $TE_n$. For three-point methods, n=1, 2, and 3, a pixel at the location (x,y) of the acquired image may have complex signal values $I_n(x,y)$. Assuming that the echo times are much shorter than the $T_2$'s of the tissues present, we may ignore the magnitude difference due to $T_2$ decay between acquisitions. A signal model described by Equation (1) may take into account the aforementioned factors: (assume n=1, 2, and 3 and two chemical species, water and fat).

$$\underbrace{\begin{pmatrix} I_1(x,y) \\ I_2(x,y) \\ I_3(x,y) \end{pmatrix}}_{S(x,y)} = \underbrace{\begin{pmatrix} e^{j2\pi\psi(x,y)TE_1} & 0 & 0 \\ 0 & e^{j2\pi\psi(x,y)TE_2} & 0 \\ 0 & 0 & e^{j2\pi\psi(x,y)TE_3} \end{pmatrix}}_{\Psi(\psi(x,y))} \underbrace{\begin{pmatrix} 1 & e^{j2\pi\Delta fTE_1} \\ 1 & e^{j2\pi\Delta fTE_2} \\ 1 & e^{j2\pi\Delta fTE_3} \end{pmatrix}}_{A} \underbrace{\begin{pmatrix} W(x,y) \\ F(x,y) \end{pmatrix}}_{\Gamma(x,y)} \quad (1)$$

We denote $S(x,y)$ the "image vector", $\Psi(\psi(x,y))$ the "field map matrix", A the "chemical shift matrix" ($\Delta f \approx -210$ Hz at 1.5 T may be a chemical shift between water and fat signals), and $\Gamma(x,y)$ the "signal vector" ($W(x,y)$ and $F(x,y)$ may represent complex water and fat signal values). Given the field map matrix $\Psi(\hat{\psi}(x,y))$, where $\hat{\psi}(x,y)$ may denote an estimate of the field map value at (x,y), the signal vector $\Gamma(x,y)$ may be estimated optimally in a least-squares sense by solving Equation (2)

$$\hat{\Gamma}(x,y) = (A^T A)^{-1} A^T \Psi(\psi(x,y))^{-1} S(x,y) \quad (2)$$

The diagonal matrix $\Psi(\hat{\psi}(x,y))^{-1}$ may have diagonal entries $$[e^{-j2\pi\hat{\psi}(x,y)TE_1}\ e^{-j2\pi\hat{\psi}(x,y)TE_2}\ e^{-j2\pi\hat{\psi}(x,y)TE_3}].$$

Figure 2:
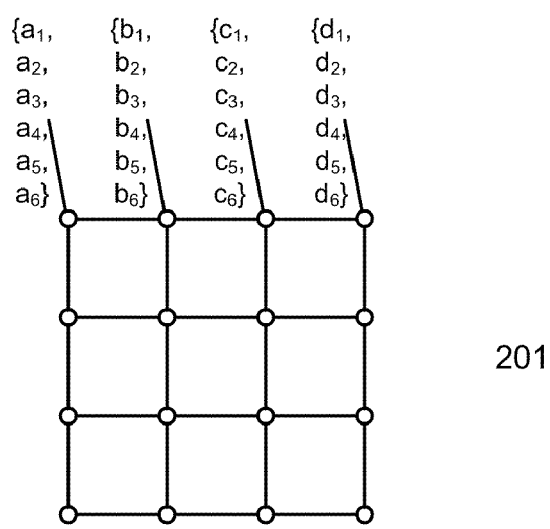
FIG. 2 illustrates a two-dimensional image grid of connected pixels with a set of feasible field map values associated with each pixel.

With reference to Equation (2), a least-squares estimate of the signal vector $\hat{\Gamma}(x,y)$ may be associated with an estimation error. This error may be defined as a cost function J for the estimate of the field map value $\hat{\psi}(x,y)$. The cost function may be given by $J(\hat{\psi}(x,y)) = \|(A(A^T A)^{-1} A^T - I)\Psi(\hat{\psi}(x,y))^{-1} S(x,y)\|$. For notational simplicity, we drop the location index (x,y) that reflects the dependence of J and $\Psi$ on the estimated field map $\hat{\psi}$. FIG. 1 shows a typical plot of the cost function $J(\hat{\psi})$ acquired from a bone-marrow pixel of a lower-leg study at 3 T. The cost function $J(\hat{\psi})$ has multiple local minima 101 within a range 102 of inhomogeneity values and is periodic with a fundamental period 100 of $1/\Delta TE$. Note that the period 100 of the cost function is the same as the spectral FOV within which field inhomogeneities can be resolved without ambiguity. A simple approach to identifying all local minima is to sample the cost function at a reasonable interval (e.g., 1 Hz), followed by locating the field map values yielding lower costs than their immediate neighboring values. Each local minimum of the least-squares cost function may provide a feasible field map value. Within a frequency range that covers an expected set of field inhomogeneities from −1500 Hz to 1500 Hz, there exist multiple local minima, which may serve as possible field map values. Across the range 102 of field inhomogeneities from −500 Hz to 500 Hz, the cost function $J(\hat{\psi})$ in FIG. 1 has six local minima that may specify a set of six feasible field map values $\{a_1, a_2, a_3, a_4, a_5, a_6\}$. As shown in FIG. 2, each pixel in a connected grid of pixels 201 may have its own set of feasible field map values. As such, field map estimation may become a problem of selecting from these sets of feasible values a field map value for each pixel such that the resultant field map is smooth-varying. The field map may be estimated by choosing from a plurality of sets of feasible field map values using a combinatorial optimization algorithm with a smoothness constraint.

Based on studies of three-point water-fat separation, the set of feasible field map values has been shown to possess key characteristics. Within a spectral FOV of width $1/\Delta TE$, at most two feasible field map values may exist. Also, inside the spectral FOV, a unique field map value may exist if a pixel contains both water and fat signals, while two feasible field map values may exist if the pixel contains a signal from only one chemical species (water or fat). The robustness of field map estimation may be improved by taking into account the periodicity of the feasible field map values. Inside a frequency range $[-\psi_{max}, \psi_{max}]$ that covers a worst possible field inhomogeneity (e.g., $\psi_{max}$ may equal 1000 Hz or 1500 Hz in some applications), the replicas of a feasible field map value $\psi$ may be denoted as $\psi_k = \psi + k/\Delta TE$, where k may be an integer in $[-\psi_{max}/\Delta TE, \psi_{max}/\Delta TE]$. Due to the acquisition noise and the fact that most pixels may be either water-dominant or fat-dominant, most pixels may possess two feasible field map values $\psi_0$ and $\psi_1$, within a spectral FOV centered at 0 Hz. Both a first field map value $\psi_0$ and a second field map value $\psi_1$ may separate water and fat signals at a corresponding pixel, but each field map value may assign the separated signals to different display images. The set of field map values within the spectral FOV, together with their replicas, may form a feasible set of field map values.

The characteristics of field map values described above may explain the common failure in current water-fat separation techniques, namely that the water and fat fragments may be swapped in the separated display images. The swapped result may occur from an erroneous selection of a field map value from the feasible set of field map values. The erroneous selection may be caused by aliasing in the spectral FOV. For example, a typical echo spacing of 1.6 ms may give a spectral FOV of 625 Hz, which may accommodate only up to 5.2 ppm (parts per million) field imhomogeneities at 3 T. On the other hand, challenging anatomies, such as an ankle, may induce severe inhomogeneities of approximately 7 to 8 ppm. When aliasing in the spectral FOV occurs, local greedy algorithms (e.g. region growing), which may select field map values only based on local neighboring pixels, may fail to produce globally smooth-varying field maps.

As described above, pixel-wise water-fat separation may not guarantee uniform water-fat separation across an image. Instead, a combinatorial problem may be solved to obtain a globally smooth-varying field map; specifically, at each pixel, one value may be selected from a feasible set of field map values such that a resultant field map either correctly separates water and fat signals or consistently swaps water and fat signals for all pixels. One smoothness constraint previously used for field maps may minimize the following cost function is given by Equation (3)

$$C_\psi = \sum_p \sum_{q \in N_p} (\psi_p - \psi_q)^2 \quad (3)$$

where p and q may be neighboring pixels on a two-dimensional image grid, and $N_p$ may denote a set of pixels neighboring to p. The variables $\psi_p$ and $\psi_q$ may denote selected field map values at pixels p and q respectively. The smoothness constraint of Equation (3) may prove non-optimal, as the optimized result may be lower than the cost of the ground-truth solution. Thus better models and cost functions may be required. Also, a solution to the minimization problem may be computationally intractable in general. Various heuristics have been designed, but they only show success under conditions of mild spectral aliasing.

We propose a generalized smoothness constraint that may accommodate scenarios with severe spectral aliasing. One proposed smoothness constraint is to minimize the number of inconsistent neighboring field map values. Selected field map values $\psi_p$ and $\psi_q$ are "inconsistent" if $$|\psi_p - \psi_q| > \max\left(\min_{\psi_j \in F_q} |\psi_p - \psi_j|, \min_{\psi_j \in F_p} |\psi_j - \psi_q|\right) \quad (4)$$

where $F_p$ and $F_q$ denote feasible sets of field map values at the neighboring pixels p and q respectively. Two neighboring field map values may be considered inconsistent when none of the two values are the closest to the other. An objective is to obtain reliable estimation of field maps with as few inconsistent pairs as possible.

Methods

JIGSAW comprises four main components:

A sum-product belief propagation (BP) algorithm, which passes soft-decision messages among pixels and jointly estimates a most likely field map value for each pixel.

BP-guided decimation, which fixes a segment with consistent field map values. For each pixel in a fixed segment, one field map value is selected from a feasible set and stays unchanged. Subsequently, boundary values of the fixed segment are used to impose soft prior weights, which correspond to the likelihood of the feasible field map values, on neighboring pixels.

A "swap" move, which shifts each field map value in a segment to an adjacent value in the feasible set so as to minimize the number of inconsistent pairs across segment boundaries.

A three-dimensional extension, which treats a completed two-dimensional field map as a fixed segment in three-dimensional space. The soft prior weights imposed by the two-dimensional field map facilitate the field map estimation in its neighboring slice.

A "decimated set" may refer to a set of pixels whose field map values are fixed at a certain stage of the field map estimation. A two-dimensional JIGSAW technique using three of the components listed above is outlined as follows:

Initialize a decimated set by fixing a field map value to be (arg min $|\psi_p|$) for a pixel at the centroid of a foreground mask.

Repeat the following steps until the decimated set includes all pixels

Run sum-product BP with soft prior weights from the current decimated set;

Enlarge the current decimated set to include smooth segments of consistent field map values that also have consistent boundaries that adjoin the current decimated set;

If smooth segments with inconsistent boundaries remain after running BP:

Identify a smooth segment with inconsistent boundaries that adjoin the current decimated set;

Swap the smooth segment to minimize the number of inconsistent pairs across the smooth segment boundary;

Enlarge the current decimated set by including the swapped smooth segment.

A foreground mask may be constructed to include pixels having a magnitude (i.e. a norm of the complex valued pixel) greater than the tenth percentile. A pixel at the centroid of the foreground mask may serve as an initial decimated set. (The choice of a starting pixel and its field map value may be flexible, as the selected field map value of the starting pixel should exist inside a smooth-varying field map that leads to a uniform water-fat separation. We only need to ensure that the starting pixel has reasonably high SNR, i.e. large signal magnitude.) The decimated set may be enlarged at each step of the two-dimensional JIGSAW technique until the field map values at all pixels are fixed.

Sum-Product Belief Propagation

Figure 3:
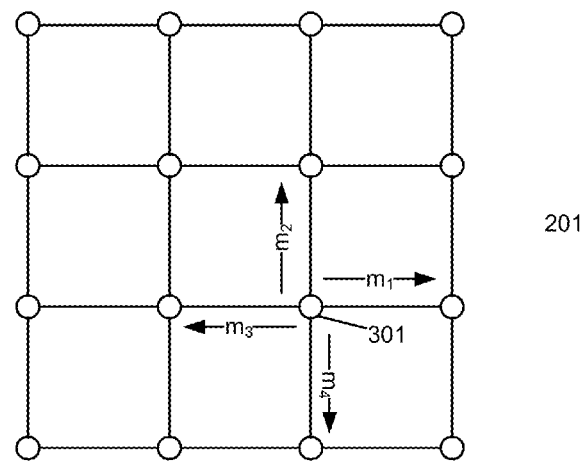
FIG. 3 illustrates a two-dimensional image grid of connected pixels and a pixel passing messages to neighboring pixels.

Sum-product belief propagation (BP) has been successfully applied in coding. BP is an iterative message-passing algorithm on a graphical model where messages are passed from a pixel to all of its neighbors on the graph. On a tree structured graph, or a graph with a single loop, BP may compute the correct marginal probability for a vector of values at each node. As illustrated in FIG. 3, for field map estimation, BP may be used on a "four-connected" two-dimensional image grid 201, where each pixel has four neighboring pixels. During an iteration, a message may be passed from every pixel to its four neighbors. FIG. 3 shows a pixel 301 passing messages $m_1$, $m_2$, $m_3$ and $m_4$, each to a corresponding neighboring pixel.

For two neighboring pixels p and q, $N_p$ may denote a set of neighboring pixels to p, and $N_p\backslash q$ may denote a set of neighboring pixels to p other than q. Let $F_p$ and $F_q$ denote the feasible sets of field map values at the pixels p and q respectively. Equation (5) computes one element of a message going from p to q at a $t^{th}$ iteration. In particular, Equation (5) conveys a probability that the pixel q takes the value $\psi_q$ in $F_q$.

$$m_{p \to q}^t(\psi_q) = \sum_{\psi_p \in F_p} \left( V_{pq} \prod_{s \in N_p \backslash q} m_{s \to p}^{t-1}(\psi_p) \right) \quad (5)$$

$$V_{pq} = \exp(-(\psi_p - \psi_q)^2 / \sigma_\psi^2) \quad (6)$$

Equation (6) may denote the interaction potential between two field map values $\psi_p$ and $\psi_q$. The interaction potential may take a Gaussian distribution where $\sigma_\psi$ may denote the standard deviation of the Gaussian distribution. The sum-product BP on the two-dimensional image grid may be considered a soft-decision counterpart to an energy minimization algorithm called max-product belief propagation. Unlike max-product belief propagation, we may not minimize a particular energy cost function, but rather use an energy cost function to search for locally smooth segments. Different cost functions or parameters may affect the intermediate steps of segment formation only, but not a final result.

Each element of a BP message may indicate the likelihood of a corresponding field map value, summed over the probability of each field map value for the sending pixel (hence the name sum-product). An interpretation of the message in Equation (5) is as follows: the terms in the product compute the probability of node p taking field map value $\psi_p$, based on beliefs from neighboring nodes other than q. For each field map value $\psi_p$, the probability of $\psi_q$ at pixel q may be computed via the interaction potential $V_{pq}$. The overall probability of $\psi_q$ may be obtained by summing over the distribution of $\psi_p$.

After T iterations of BP message passing, a belief vector $b_q$ may be computed for the pixel q. (In one implementation, the BP algorithm may run for T=30 iterations before the beliefs are computed.) The element of $b_q$ corresponding to the value $\psi_q$ may be given by $$b_q(\psi_q) = \prod_{p \in N_q} m_{p \to q}^T(\psi_q).$$

Subsequently for the pixel q, a field map value $\psi_q^*$ that corresponds to a largest element of the belief vector $b_q$ may be selected.

BP-Guided Decimation

Decimation may refer to the fixing of field map values at one or more pixels. Decimation has been proposed by statistical physicists to solve constraint satisfaction problems. By decimating successively, and running BP with prior beliefs from the decimated set, the BP algorithm may converge to one specific solution of the constraint satisfaction problem. The first pixel, which may be chosen at the centroid of the foreground mask, may serve as an initial decimated set. A message from a decimated pixel p, whose field map value may be fixed to $\psi_p$, to its neighboring free (not decimated) pixel q may be given by Equation (7) as $$m_{p \to q}^t(\psi_q) = V_{pq} \quad (7)$$

for all t. Only decimated pixels on the boundary of the decimated set may send messages. (Decimated pixels interior to the decimated set may not send messages.) The messages may serve as an initial interaction potential to guide the selection of field map values at the rest of the pixels.

Figure 4:
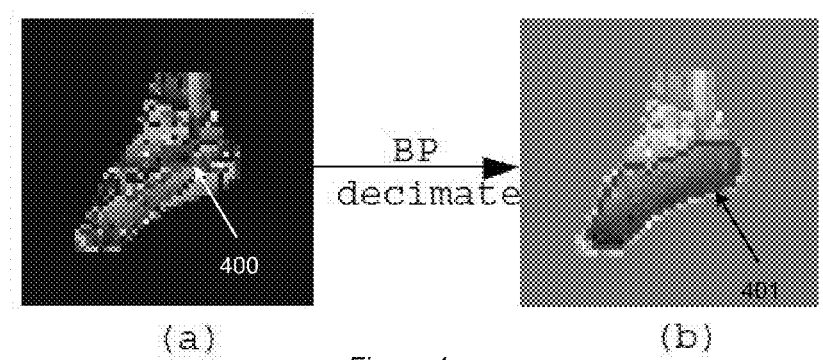
FIG. 4 illustrates growth of a field map segment by belief propagation decimation.

After new field map values are chosen for the rest of the pixels based on beliefs from the BP algorithm, the decimated set may be enlarged to include pixels that satisfy a smoothness constraint with all their neighbors as illustrated in FIG. 4. An exemplary smoothness constraint is given by Equation (4). A field map (a) in FIG. 4 shows field map values for all pixels and a current decimated set 400 (area boldly outlined) before running BP. The field map (b) in FIG. 4 shows new field map values obtained from BP for pixels outside the original decimated set. The area 401 boldly outlined in field map (b) of FIG. 4 indicates a decimated set enlarged to include a new segment that is consistent within itself and consistent with the original decimated set of field map (a).

Swap Move

Due to multiple inter-connected loops on the two-dimensional grid, the BP algorithm may select field map values for a large segment of pixels that are consistent among themselves, but ignores the guidance from boundary values of the decimated set. This may result in smooth segments of pixels bordering the decimated set but retaining inconsistent boundaries between them. While a more carefully selected cost function may prevent inconsistent boundaries, such a cost function may be difficult to find in general and may also be data dependent. Instead, we recognize that the field map estimation problem has more than one solution. Thus, a ground-truth field map, with values at all pixels shifted to an adjacent value in the respective feasible set, may also separate water and fat signals consistently.

We propose a "swap" move that exploits characteristics of feasible field map values for most pixels dominated by a single species; that is, adjacent values in a set of field map values may lead to a swap of separated water and fat signals. A smooth segment, which has inconsistent boundaries with the decimated set, may contain important information leading to a consistent solution. In fact, a consistent solution may be obtained by shifting each pixel's field map value in the entire smooth segment with inconsistent boundaries to an adjacent value in each pixel's feasible set of field map values simultaneously. The "swap" move may be described as follows.

Let S be a smooth segment within which pixels are consistent among themselves; i.e., for any two neighboring pixels p and q, $|\psi_p - \psi_q|$ satisfies the smoothness constraint of Equation (4). Let $\psi_S$ denote the field map restricted to the segment S. Suppose for each pixel the values in its feasible set are ordered from the smallest to the largest, and let $i_p$ denote an index of a current value for $\psi_p$ in the feasible set $F_p$. Define the operator $\Gamma^k$ on the restricted field map $\psi_S$ as the component-wise operator where $$\Gamma^k \psi_p = F_p(i_p + k), \forall p \in S.$$

A positive k shifts each field map value in S to the $k^{th}$ value after it in the feasible set, and a negative k shifts each field map to the $|k^{th}|$ value before it in the set. The "swap" move may locate a set of values under the operator $\Gamma^k$ that produces a smoothest boundary to the decimated set D. Let $\psi^*_S = \Gamma^j \psi_S$ and $$j = \underset{k}{\mathrm{argmin}} \sum_{p \in D, q \in S, q \in N_p} |\Gamma^k \psi_q - \psi_p|.$$

Hence, the shift results in $\psi^*_S$ (a new field map restricted to the segment S), which minimizes the distance, i.e., the inconsistency constraint of Equation (4), between neighboring pairs across the segment boundary.

Figure 5:
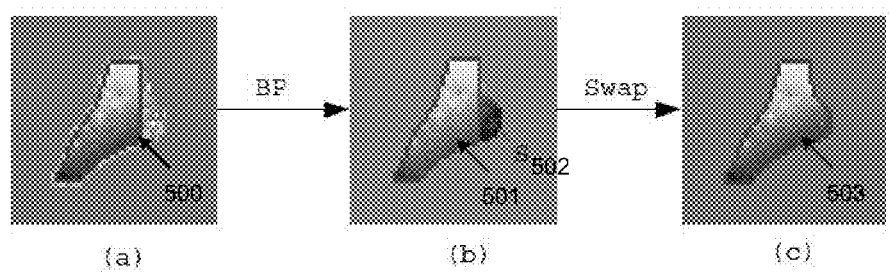
FIG. 5 illustrates growth of a field map segment by swapping values in a bordering segment.

FIG. 5 illustrates changes to field map values after running BP and a "swap" move. A segment 500 of a field map (a) in FIG. 5 indicates a current decimated set before running BP. After running BP, the segment 500 of field map (a) is extended to become a segment 501 of a field map (b) based on BP for pixels outside of the current decimated set. A segment "S" 502 in field map (b) of FIG. 5 indicates a segment consistent within itself but inconsistent across a boundary with the decimated set 501. In the field map (c) of FIG. 5 the segment 503 indicates "swapped" field map values for the segment S 502 and the consequent enlargement of the decimated set 501 to include the segment S 502.

Extensions to Three Dimensions

The JIGSAW method may be extended to three dimensions by treating a two dimensional field map as a decimated subset in three dimensions. The resulting field map may be smooth-varying within the same tissue along a third dimension. Let $S_1$ indicate a two dimensional slice whose field map has been estimated using the two dimensional JIGSAW technique, and let $S_2$ denote a neighboring slice whose field map is to be estimated. Let $p_1$ and $p_2$ denote neighboring pixels along the third dimension, with $p_1$ and $p_2$ sharing the same two-dimensional coordinate in slices $S_1$ and $S_2$. A BP message from pixel $p_2$ to a neighboring pixel $q_2$ in slice $S_2$ during the $t^{th}$ iteration may be given by $$m^t_{p_2 \to q_2}(\psi_{q_2}) = \sum_{\psi_{p_2} \in F_{p_2}} W_{p_2} \left( V_{p_2 q_2} \prod_{s \in N_{p_2} \backslash q_2} m^{t-1}_{s \to p_2}(\psi_{p_2}) \right) \quad (8)$$

where $$W_{p_2} = \exp(-(\psi_{p_1} - \psi_{p_2})^2 / \sigma_\psi^2) \quad (9)$$

may indicate the interaction potential along the third dimension between the two field map values $\psi_{p_1}$ and $\psi_{p_2}$. As the value $\psi_{p_1}$ may be fixed, the term $W_{p_2}$ may be viewed as a self-potential, or prior weight on the set of possible values, at $p_2$.

The computation of the element of the belief vector $b_{q_2}$ may be modified to be $$b_q(\psi_q) = W_{q_2} \prod_{p_2 \in N_{q_2}} m^T_{p_2 \to q_2}(\psi_{q_2})$$

which is a product of all incoming message from two-dimensional neighbors multiplying with the self-potential due to the three dimensional neighbor. The field map of $S_2$ may be chosen to be the value that maximizes the belief at each pixel. No decimation or swap move may be required, as the self-potential due to the field map of $S_1$ may supply information from an additional dimension and may reduce ambiguity from the two-dimensional problem. On the other hand, the soft nature of the self-potential may account for a potentially large variation of inhomogeneities along the third dimension.

It may be possible that errors in an inconsistent estimation of a first two dimensional field map may propagate through the three dimensional extension. An error may be reduced by obtaining field maps for a few two dimensional slices close to the center of a three dimensional slab, and by choosing the smoothest field map as the initial two dimensional decimated set.

Results

With approval from the Institutional Review Board of Stanford and informed consent from each subject, volunteer data were acquired at a 3T scanner (GE Healthcare Technologies, Milwaukee, Wis., USA). To validate the ability of the proposed method in handling large field inhomogeneities with limited spectral FOV, a multi-echo GRE sequence was used to scan an ankle of a healthy volunteer at 3T. A quadrature extremity coil was used with the following imaging parameters: $TE_{1,2,3}$=3.2, 6.4, 9.6 ms, acquisition matrix 256× 256×64, FOV=20×20×5 cm, receiver bandwidth±83.3 kHz, TR=11 ms, and flip angle of 10°. The echo spacing is 3.2 ms (leading to $8\pi/3$ phase developed between echoes). Echo times were chosen to achieve near optimal noise performance. For the ankle study, the data was acquired from multiple coils and combined using sum-of-squares, before being processed with the proposed method.

Figure 6:
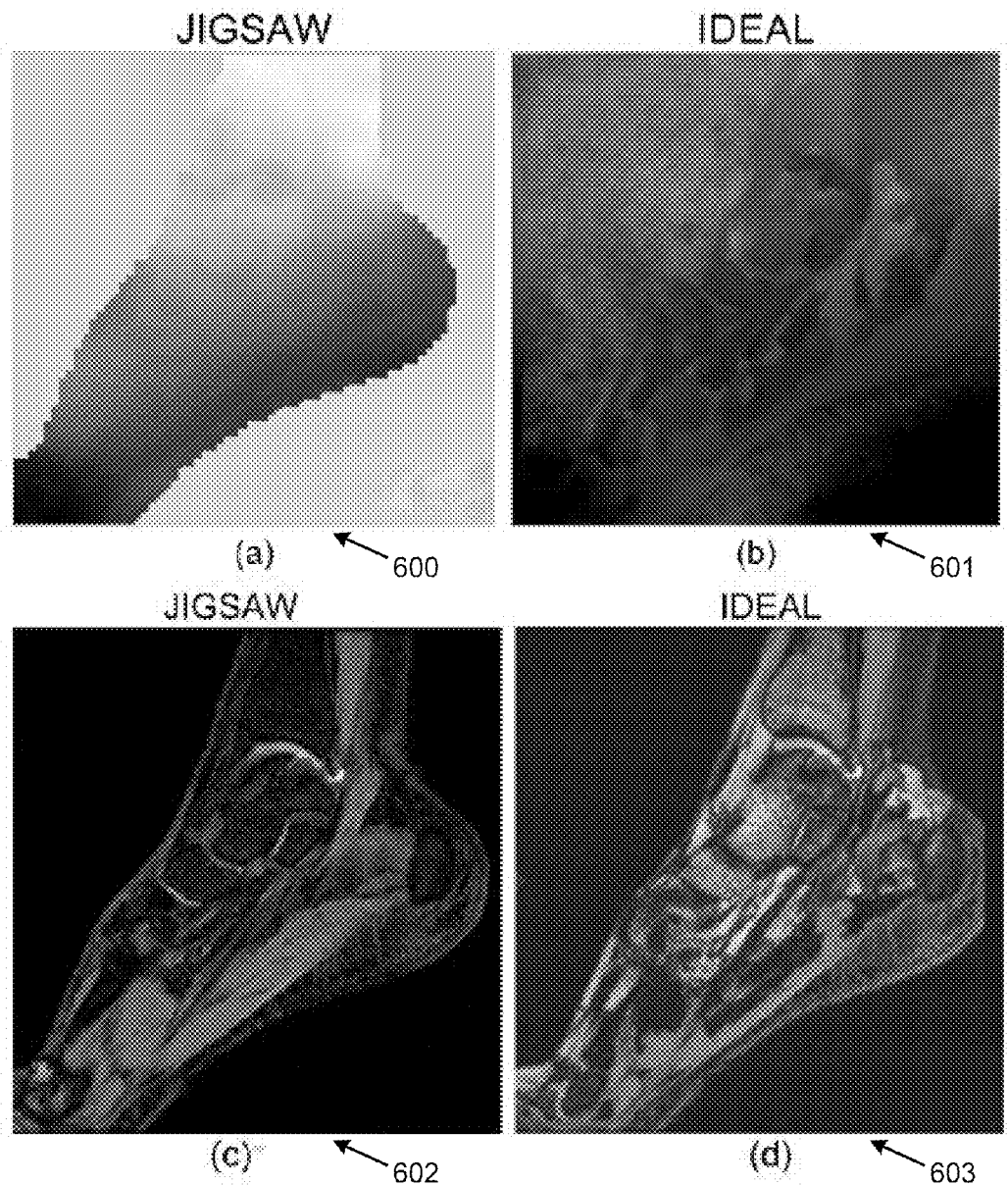
FIG. 6 illustrates field maps generated using JIGSAW and IDEAL methods and associated water display images for each method.

Water-fat separation of ankle scans at 3T may be challenging due to large field inhomogeneities from inadequate shimming and/or susceptibility variations. FIG. 6 illustrates two field maps 600(*a*) and 601(*b*) and two corresponding separated water display images 602(*c*) and 603(*d*) generated from their respective field maps. A sample slice of the ankle study was obtained using both the JIGSAW method and the IDEAL method implemented on a GE scanner. The relatively long echo-spacing of 3.2 ms in the study results in a spectral FOV of 312.5 Hz, which is insufficient to accommodate the field inhomogeneities present that range from −450 Hz to +400 Hz. As a result, the IDEAL method implemented on the GE scanner produces a highly fragmented field map 601, which causes failure in water-fat separation as shown by the water image 603. In contrast the JIGSAW method correctly resolves field inhomogeneities in this challenging scenario yielding the field map 600 and the corresponding water image 602 that uniformly separates water and fat.

Advantages Over Existing Methods

Existing techniques for multi-point water-fat separation include the IDEAL method described by Yu et al. in "Field Map Estimation with a Region Growing Scheme for Iterative 3-Point Water-Fat Decomposition," 2005, Magn. Reson. Med., Vol. 54, No. 4, pp. 1032-1039; the VARPO method described by Hernando et al. in "Joint Estimation of Water/

Fat Images and Field Inhomogeneity Map," 2008, Magn. Reson. Med., Vol. 59, No. 3, pp. 571-580; and the "region unwrapping" method described by Jenkinson in "Fast, Automated, N-dimensional Phase Unwrapping Algorithm," 2003, Magn. Reson. Med., Vol. 49, pp. 193-197. The IDEAL method assumes that most field map values are within a spectral FOV centered at 0 Hz and uses region growing to extrapolate to large field map values. The VARPO method optimizes a cost function that combines the goodness of fit of field map values into pre-defined ranges and minimizes boundary differences among regions formed thereby.

The proposed JIGSAW method may consider the periodic nature of feasible field map values and assembles a field map that may span multiple spectral FOVs. Existing methods in contrast may assume sufficiently large spectral FOVs, which may not hold in certain scenarios. For example:

High field strength: When imaging at high field strengths (e.g. 3T), which beneficially results in high SNR, field inhomogeneities may increase proportionally with field strength. An increase in the field inhomogeneities may lead to aliasing in the spectral FOV.

High resolution imaging with multi-echo sequences: To circumvent the relatively long scan times of phase-sensitive water-fat separation, multi-echo sequences have been proposed to acquire multiple echoes in a single repetition. However, the echo spacing in a multi-echo sequence may necessarily be longer due to the fly-back gradients and readout times. In addition, long readout times may be required to achieve high-resolution imaging. All of these factors may contribute to a longer echo spacing, which in turn may reduce the spectral FOV.

Anatomies with large field inhomogeneities: There is still a lack of reliable fat suppression solutions around challenging anatomies where good shimming cannot be easily achieve (e.g., breast and ankle). This may result in large field inhomogeneities that may require a very large spectral FOV to avoid aliasing. In addition, field inhomogeneities near metallic implants may exceed the current size of spectral FOV.

Another advantage of the JIGSAW method is that a predetermined cost function need not be optimized, as accurate cost models and cost functions may be difficult to obtain. For instance, a swapped field map in some segments of an image may have a lower cost than a correct field map. With a particular cost function, a low cost within a segment may warrant a large distance across segment boundaries, which may result in a field map containing swapped fragments.

The JIGSAW method separates the task of forming large, consistent segments and the task of assembling segments with minimum cost across boundaries. The JIGSAW method may be superior to a region unwrapping method that forms regions according to fixed frequency intervals and implicitly depends on a relatively large spectral FOV to obtain a manageable number of regions. A field map for the ankle shown in FIG. 5 may lead to such a large number of regions when using the region unwrapping method that a solution may prove intractable.

Variations and Modifications

The JIGSAW method described may initialize the BP algorithm by fixing a field map value of one pixel to a feasible value closest to 0 Hz. To increase robustness, two values on each side of 0 Hz, which may lead to a swapped field map and a correct field map respectively, may be used instead of only one value. One of the two field maps thus generated may be significantly smoother than the other, which may reduce the number of large segments and thereby improve robustness. In some embodiments, the JIGSAW method may use a "greedy" algorithm to assemble large segments. Different methods to assemble segments, which may prove more accurate than the "greedy" algorithm, may also be used. For example, an exhaustive method may be used when a small number of segments result.

Flow Chart of a Magnetic Resonance Imaging Embodiment

Figure 7:
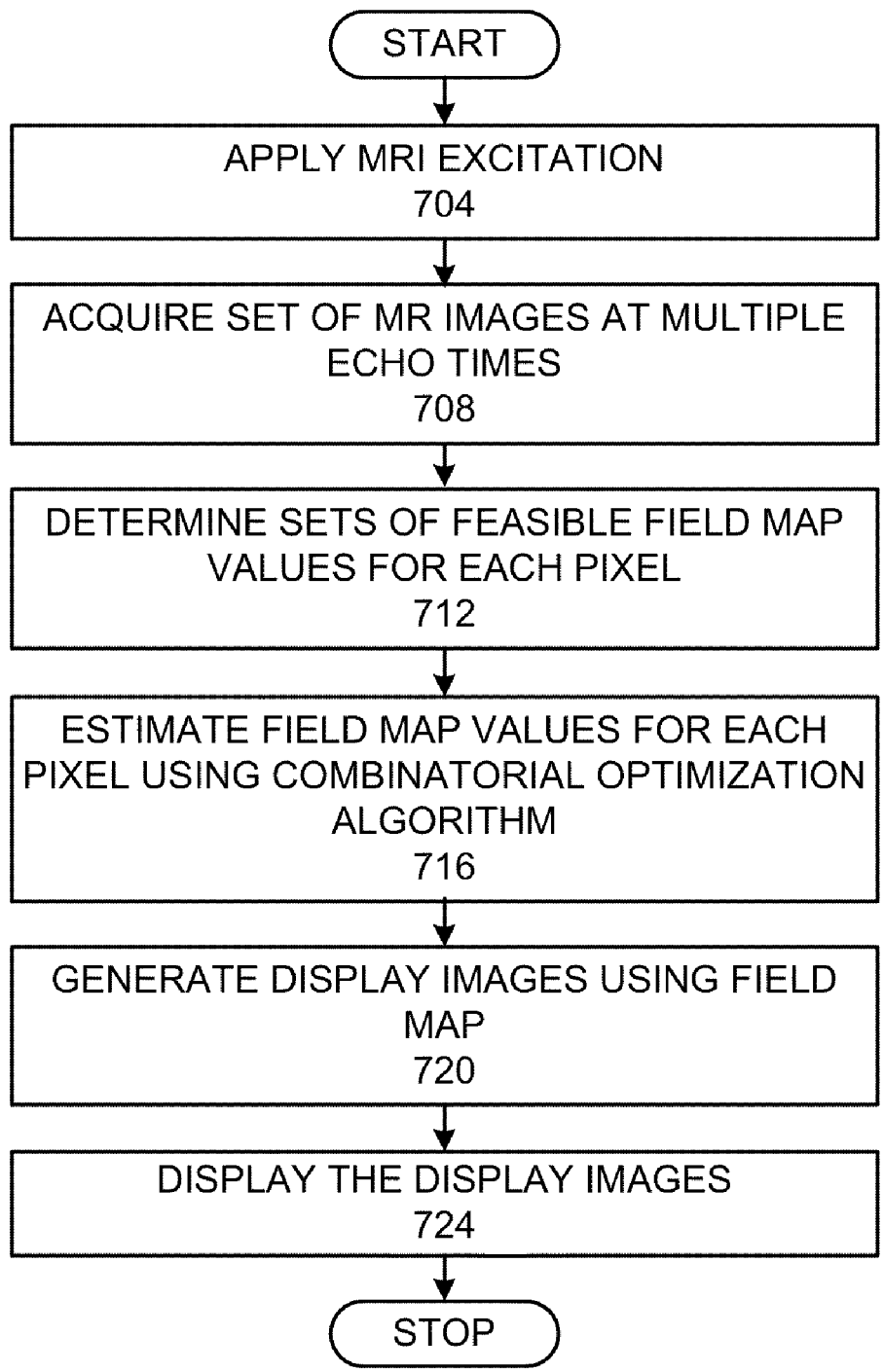
FIG. 7 illustrates a high level flow chart of an embodiment of the invention.

FIG. 7 illustrates a high level flow chart of an embodiment of the invention. In step 704, at least one magnetic resonance imaging (MRI) excitation may be applied. In step 708, a set of MR images at multiple echo times may be acquired from the MRI excitation. In an exemplary embodiment, the MR images may be reconstructed in frequency space (also called k-space). In step 712, a set of feasible field map values may be determined for each pixel using the acquired set of MR images. In step 716, a field map value for each pixel may be estimated by selecting one of the pixel's feasible field map values using a combinatorial optimization algorithm. In step 720, one or more display images, each representing a separated species, may be generated from the estimated field map. In step 724, the display images may be displayed.

Figure 8:
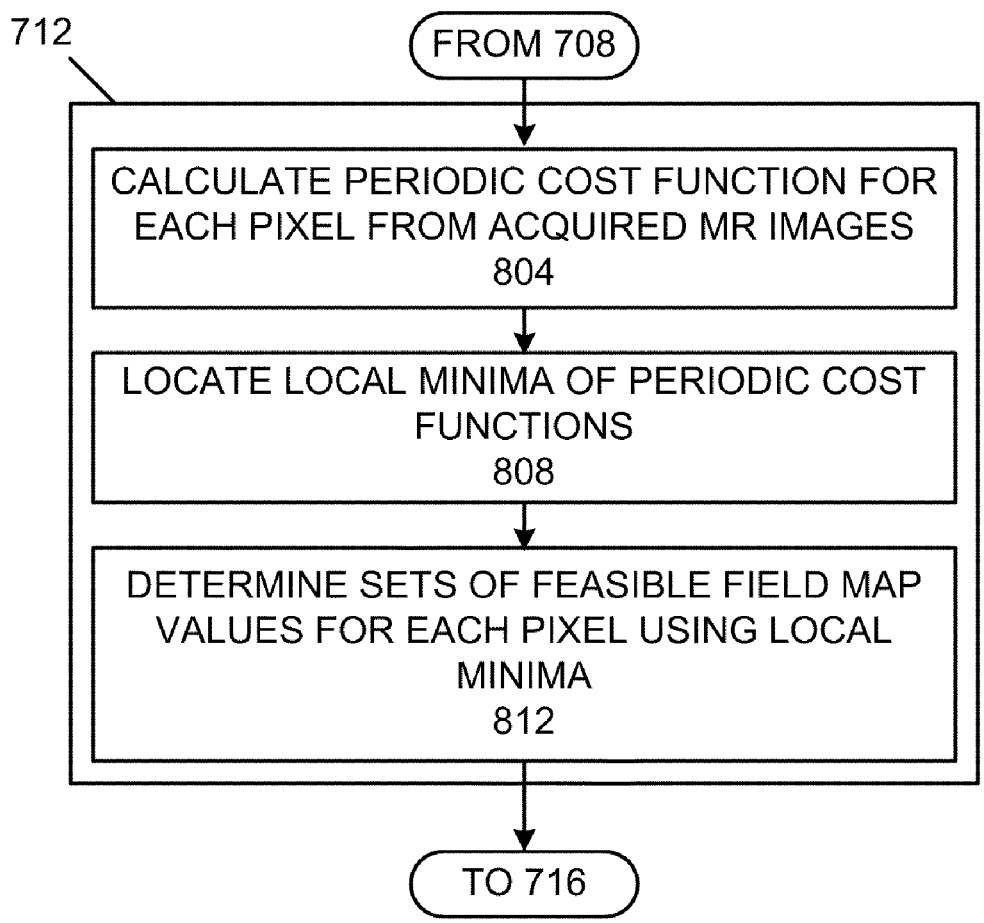
FIG. 8 illustrates steps for a feasible field map determination step of FIG. 7.

FIG. 8 outlines a method for step 712 of FIG. 7 that may generate a set of feasible field map values from the acquired set of MR images using cost functions. In step 804, a plurality of periodic cost functions may be calculated from the MR images, at least one cost function for each pixel in a field map to be estimated. In step 808, a set of one or more local minima may be located in across a region that spans a range of inhomogeneity values of a periodic cost function associated with a pixel in the field map. The region of the periodic cost function may span one or more spectral FOVs, where each spectral FOV may span a period of $1/\Delta TE$. FIG. 1 illustrates an exemplary period cost function for a pixel with a region 102 spanning more than one spectral FOV 100 and local minima 101 circled. Any search algorithm may be used to locate the minima; in some embodiments the search algorithm may be a golden section search algorithm. The set of located minima generated from a cost function for a pixel may provide a set of feasible field map values for that pixel in the field map.

Figure 9:
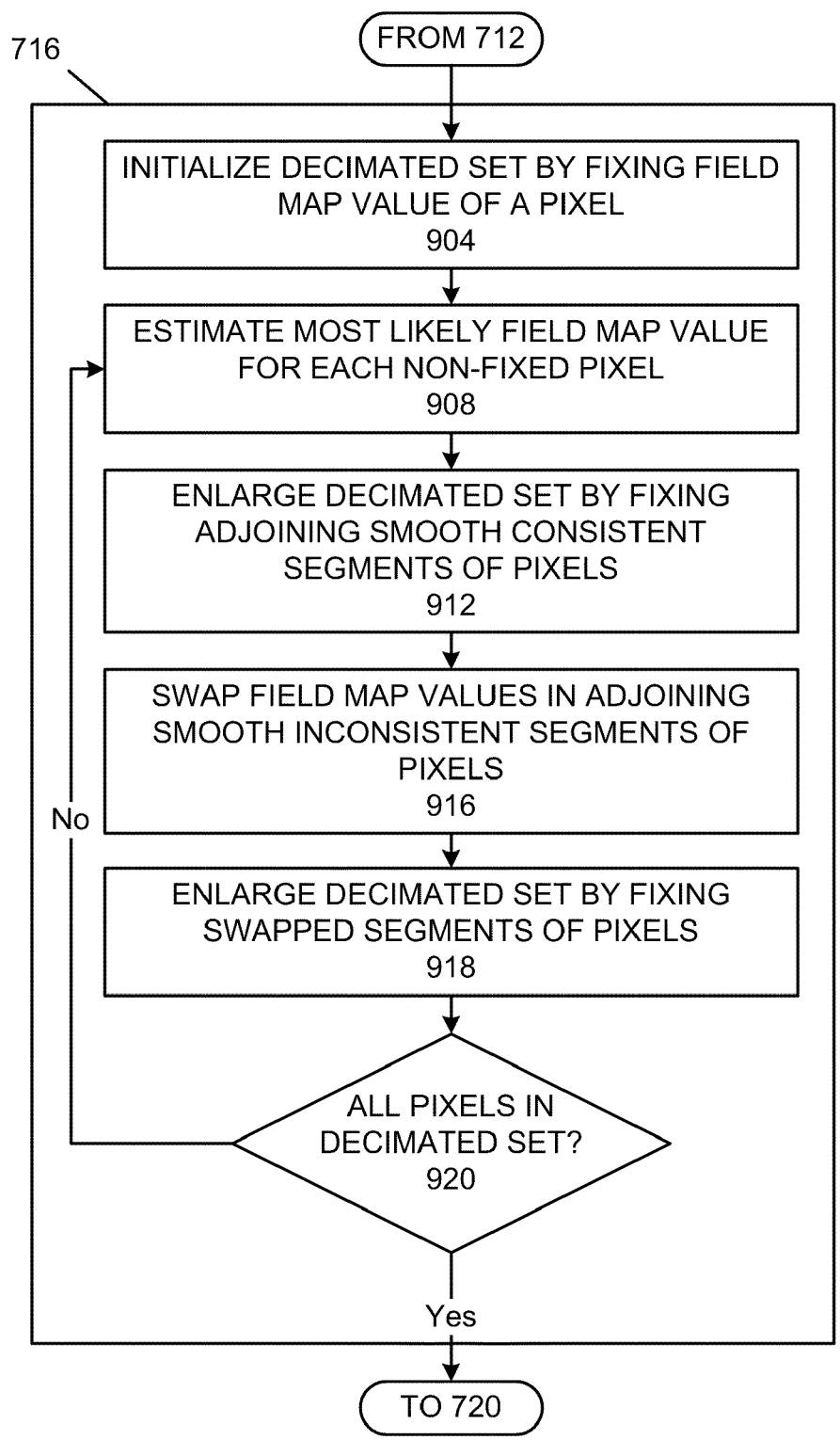
FIG. 9 illustrates steps for a field map estimation step of FIG. 7.

FIG. 9 illustrates a method for step 716 of FIG. 7 that may estimate a set of field map values chosen from the set of feasible field map values using a combinatorial optimization algorithm. In step 904, a field map value for a pixel may be fixed to one of the feasible field map values for that pixel, thereby initializing a decimated set of pixels with fixed field map values. In step 908 a most likely field map value may be estimated for each non-fixed pixel in the field map from the set of feasible field map values for the associated pixel. In step 912 the decimated set of pixels may be enlarged by fixing a field map value for each pixel in a segment of pixels adjoining the decimated set to the most likely field map value estimated in step 908 for that pixel. Only smooth segments of pixels having consistent boundaries with the decimated set may be included in step 912. In a preferred embodiment, a segment's "smoothness" may be determined using Equation (4) to test for consistency between neighboring pixels within the segment. Equation (4) may define a smoothness constraint to minimize the number of inconsistent neighboring field map values. Equation (4) may also be used to test for consistency between pixels in a smooth segment's boundary bordering the decimated set and neighboring pixels in the decimated set. Step 912 may be referred to as belief product guided decimation.

In step 916, a field map value for each pixel in smooth inconsistent segments of pixels bordering the fixed "decimated" segment may be shifted, i.e. "swapped," to an adjacent value in their respective feasible sets of field map values.

The field map value of all pixels in a segment may be swapped simultaneously, which may retain smoothness within the segment while eliminating abrupt changes in field map values at borders to the fixed "decimated" set. In step 918, the "decimated" set may be enlarged to include pixels in the swapped segments.

Step 920 may determine if all pixels in the field map are contained in the enlarged "decimated" set resulting from step 918. If all pixels are not contained in the "decimated" set then steps 908, 912, 916 and 918 may be repeated. In particular, in step 908, a new set of most likely field map values may be re-estimated for each non-fixed pixel in the field map outside of the "decimated" set of pixels with fixed field map values. Decimation in step 912 may cause neighboring segments to re-compute their most likely field map value beliefs conditioned on the fixed field map values. One or more new smooth segments of inconsistent pixels with abrupt changes from the fixed "decimated" segment may result, if the influence from the fixed "decimated" segment is weaker than the influence among pixels within the new smooth inconsistent segments.

Once all pixels are fixed in the "decimated" set then, in step 720 of FIG. 7, one or more species display images may be generated using the estimated field map. For example, a water display image and a fat display image may be generated. In step 724, the resulting display images generated in step 720 may be displayed either as separate display images or as a combined display image.

Figure 10:
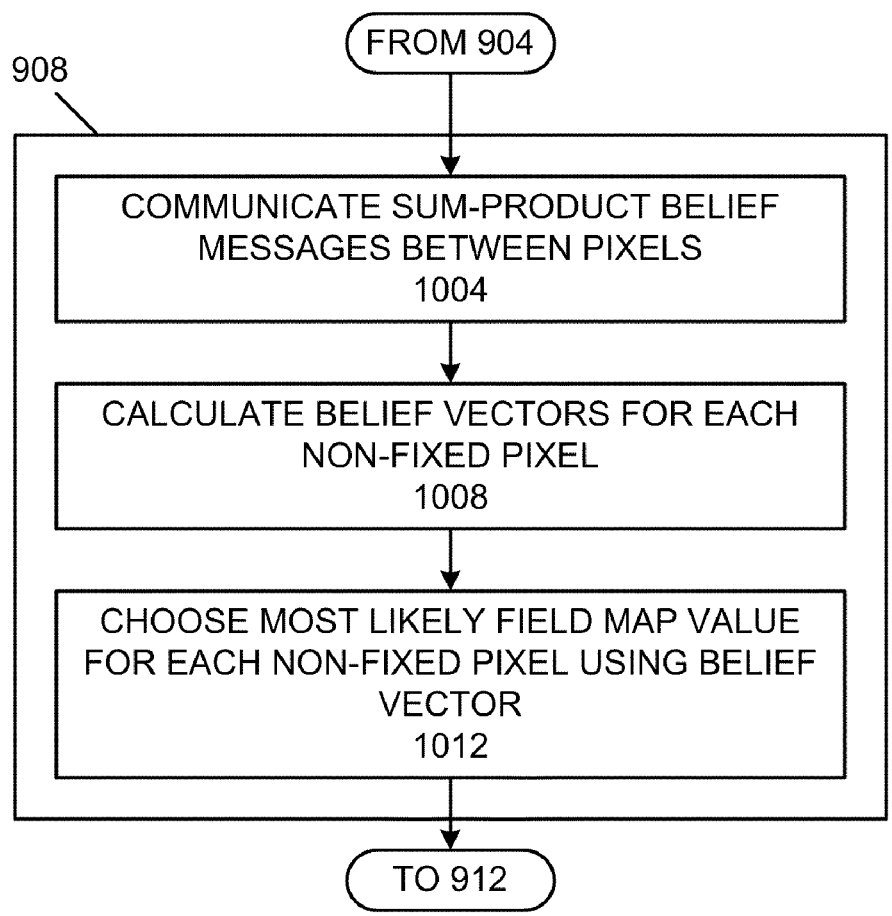
FIG. 10 illustrates steps for a most likely field map value determination step of FIG. 9.

FIG. 10 illustrates an embodiment of belief propagation in step 908. In step 1004, a set of sum-product belief propagation (BP) messages may be passed between neighboring pixels over a sequence of iterations, where each message may contain probabilistic likelihoods of field map values. After a number of iterations of BP message passing, in step 1008, a probabilistic belief may be calculated for each field map value for a pixel based on the BP messages. In step 1012, a field map value with the maximum calculated belief may be chosen as the most likely field map value for a pixel. The set of most likely field map values generated in step 908 may contain large segments of pixels within which the resulting field map may be smooth, but outside which abrupt changes may exist.

Magnetic Resonance Imaging Systems

Figure 11:
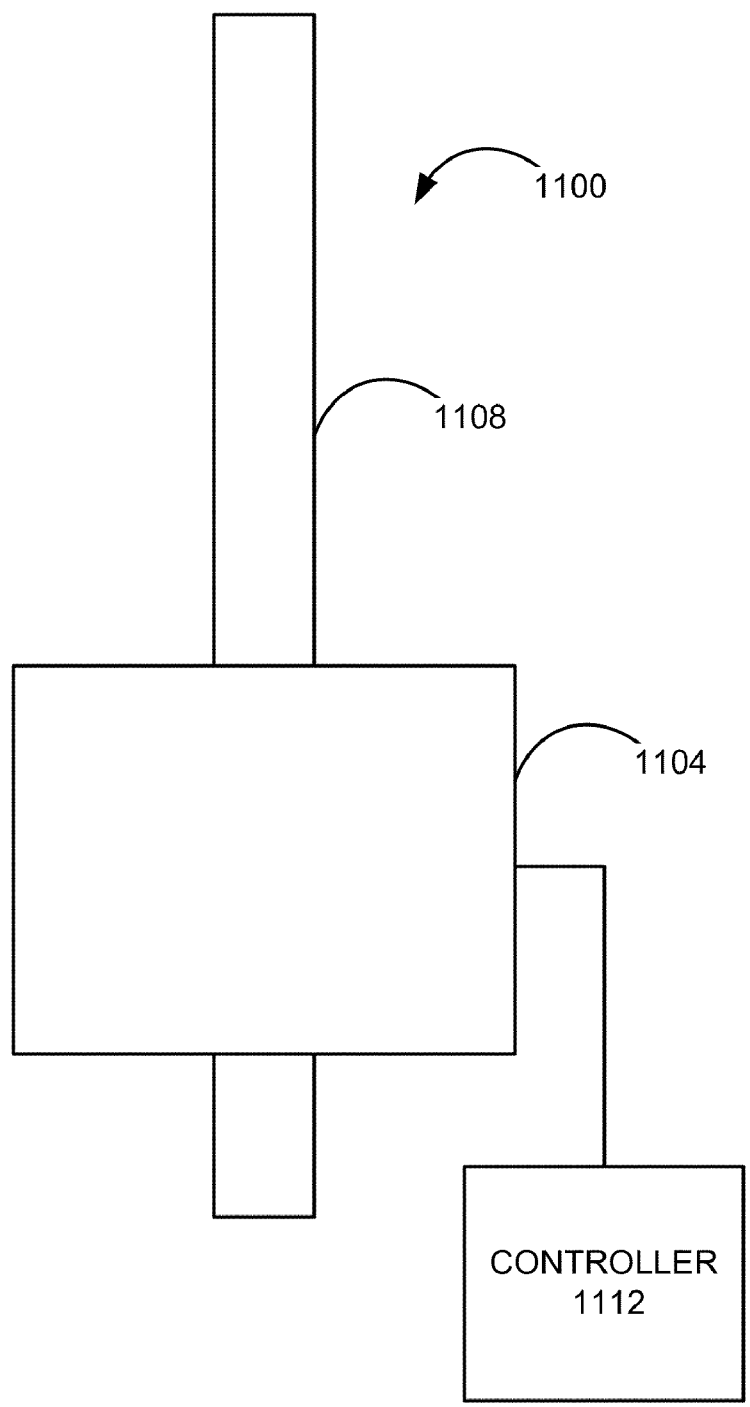
FIG. 11 illustrates a schematic top view of a magnetic resonance imaging (MRI) system that may be used in an embodiment of the invention.

FIG. 11 is a schematic top view of a magnetic resonance imaging (MRI) system 1100 that may be used in an embodiment of the invention. The MRI system 1100 comprises a magnet system 1104, a patient transport table 1108 connected to the magnet system, and a controller 1112 controllably connected to the magnet system. In one example, a patient would lie on the patient transport table 1108 and the magnet system 1104 would pass around the patient. The controller 1112 would control magnetic fields and radio frequency (RF) signals provided by the magnet system 1104 and would receive signals from detectors in the magnet system 1104.

Figure 12A:
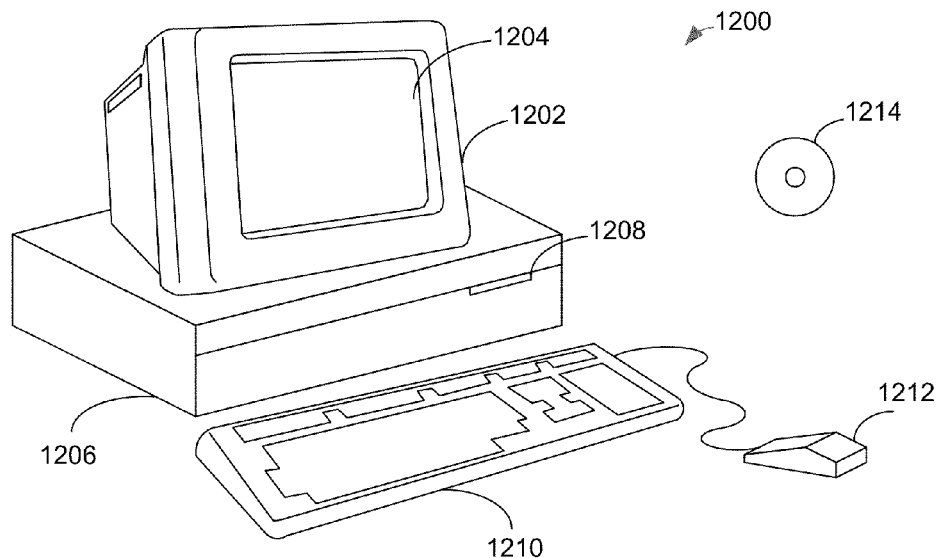
FIGS. 12(a) and 12(b) illustrate a computer system that may be used in an embodiment of the invention.
Figure 12B:
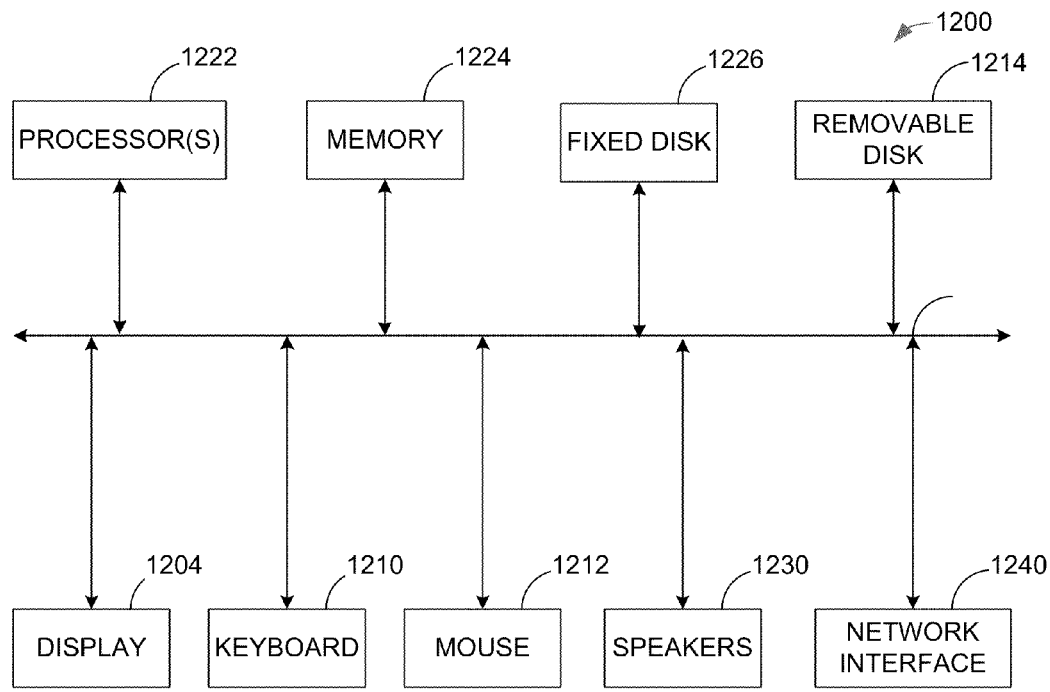

FIGS. 12(a) and 12(b) illustrate a computer system 1200, which is suitable for implementing a controller 1112 used in embodiments of the present invention. FIG. 12(a) shows one possible physical form of the computer system. Of course, the computer system may have many physical forms ranging from an integrated circuit, a printed circuit board, and a small handheld device up to a huge super computer. Computer system 1200 includes a monitor 1202, a display 1204, a housing 1206, a disk drive 1208, a keyboard 1210, and a mouse 1212. Disk 1214 is a computer-readable medium used to transfer data to and from computer system 1200.

FIG. 12(b) is an example of a block diagram for computer system 1200. Attached to system bus 1220 are a wide variety of subsystems. Processor(s) 1222 (also referred to as central processing units, or CPUs) are coupled to storage devices, including memory 1224. Memory 1224 includes random access memory (RAM) and read-only memory (ROM). As is well known in the art, ROM acts to transfer data and instructions uni-directionally to the CPU, and RAM is used typically to transfer data and instructions in a bi-directional manner. Both of these types of memories may include any suitable of the computer-readable media described below. A fixed disk 1226 is also coupled bi-directionally to CPU 1222; it provides additional data storage capacity and may also include any of the computer-readable media described below. Fixed disk 1226 may be used to store programs, data, and the like and is typically a secondary storage medium (such as a hard disk) that is slower than primary storage. It will be appreciated that the information retained within fixed disk 1226 may, in appropriate cases, be incorporated in standard fashion as virtual memory in memory 1224. Removable disk 1214 may take the form of the computer-readable media described below.

CPU 1222 is also coupled to a variety of input/output devices, such as display 1204, keyboard 1210, mouse 1212, and speakers 1230. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1222 optionally may be coupled to another computer or telecommunications network using network interface 1240. With such a network interface, it is contemplated that the CPU might receive information from the network, or might output information to the network in the course of performing the above-described method steps. Furthermore, method embodiments of the present invention may execute solely upon CPU 1222 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for estimating values of a field map in a magnetic resonance (MR) imaging system, the method comprising:
   a) applying a magnetic resonance excitation;
   b) acquiring a set of MR images at multiple echo times based on the magnetic resonance excitation;
   c) determining a set of feasible field map values for a pixel in a field map from the set of MR images; and
   d) estimating a value of the field map by choosing a field map value for the pixel from the set of feasible field map values using a combinatorial optimization algorithm that includes a smoothness constraint.

2. The method, as recited in claim 1, wherein determining the set of feasible field map values for the pixel comprises:
   i) calculating a cost function for the pixel from the acquired plurality of MR images;
   ii) locating local minima of the cost function across a range of field inhomogeneity values; and
   iii) determining the set of feasible field map values for the pixel from field inhomogeneity values at the local minima of the cost function.

3. The method, as recited in claim 2, wherein the cost function is a least squares residue function.

4. The method, as recited in claim 1, wherein the combinatorial optimization algorithm comprises:
   i) for one or more iterations, communicating a set of sum-product belief messages between the pixel and one or more neighboring pixels of the pixel in the field map;
   ii) calculating a belief vector for the pixel based on the set of sum-product belief messages received from the one or more neighboring pixels in each iteration; and
   iii) choosing a most likely field map value from the set of feasible field map values using the belief vector after the one or more iterations.

5. The method, as recited in claim 4, wherein a sum-product belief message in the set of sum-product belief messages comprises an estimated likelihood of a feasible field map value for the pixel.

6. The method, as recited in claim 4, wherein an element of the belief vector comprises an overall likelihood of a feasible field map value for the pixel.

7. The method, as recited in claim 1, wherein the combinatorial optimization algorithm comprises:
   i) estimating a most likely field map value from the set of feasible field map values for the pixel in the field map; and
   ii) fixing a field map value of the pixel to the estimated most likely field map value if the pixel satisfies the smoothness constraint with its neighboring pixels.

8. The method, as recited in claim 1, wherein the combinatorial optimization algorithm comprises:
   i) estimating a most likely field map value from the set of feasible field map values for the pixel in the field map; and
   ii) fixing a field map value of the pixel by selecting a field map value from the set of feasible field map values, wherein the field map value selected is adjacent to the estimated most likely field map value if the pixel does not satisfy the smoothness constraint with its neighboring pixels.

9. The method, as recited in claim 1, wherein the combinatorial optimization algorithm comprises minimizing a number of inconsistent pairs of field map values for neighboring pixels in the field map.

10. The method, as recited in claim 1, wherein a number of chemical species separable by the field map is less than a cardinality of the set of MR images.

11. The method, as recited in claim 1, further comprising using the estimated field map to generate a magnetic resonance display image with species separation.

12. A magnetic resonance imaging apparatus, comprising:
   a magnetic resonance excitation and detection system; and
   a controller electrically connected to the magnetic resonance imaging excitation and detection system, comprising:
      a display;
      at least one processor; and
      computer readable media, comprising:
         computer readable code for generating an estimated field map, comprising:
            a) computer readable code for applying a magnetic resonance excitation;
            b) computer readable code for acquiring a set of MR images at multiple echo times based on the magnetic resonance excitation;
            c) computer readable code for determining a set of feasible field map values for a pixel in a field map from the set of MR images;
            d) computer readable code for estimating a value of the field map by choosing a field map value for the pixel from the set of feasible field map values using a combinatorial optimization algorithm that includes a smoothness constraint;
         computer readable code for generating a magnetic resonance display image with species separation using the estimated field map.

13. The apparatus, as recited in claim 12, wherein the computer readable code for determining a set of feasible field map values for a pixel comprises:
   computer readable code for calculating a cost function for the pixel from the acquired plurality of MR images;
   computer readable code for locating local minima of the cost function across a range of field inhomogeneity values; and
   computer readable code for determining the set of feasible field map values for the pixel from field inhomogeneity values at the local minima of the cost function.

14. The apparatus, as recited in claim 13, wherein the cost function is a least squares residue function.

15. The apparatus, as recited in claim 12, wherein the computer readable code for estimating a value of the field map using a combinatorial optimization algorithm comprises:
   computer readable code for communicating a set of sum-product belief messages between the pixel and one or more neighboring pixels of the pixel in the field map for one or more iterations;
   computer readable code for calculating a belief vector for the pixel based on the set of sum-product belief messages received from the one or more neighboring pixels in each iteration; and
   computer readable code for choosing a most likely field map value from the set of feasible field map values using the belief vector after the one or more iterations.

16. The apparatus, as recited in claim 15, wherein a sum-product belief message in the set of sum-product belief messages comprises an estimated likelihood of a feasible field map value for the pixel.

17. The apparatus, as recited in claim 15, wherein an element of the belief vector comprises an overall likelihood of a feasible field map value for the pixel.

18. The apparatus, as recited in claim 12, wherein the computer readable code for estimating a value of the field map using a combinatorial optimization algorithm comprises:

computer readable code for estimating a most likely field map value from the set of feasible field map values for the pixel in the field map; and computer readable code for fixing a field map value of the pixel to the estimated most likely field map value if the pixel satisfies the smoothness constraint with its neighboring pixels.

19. The apparatus, as recited in claim 12, wherein the computer readable code for estimating a value of the field map using a combinatorial optimization algorithm comprises:

computer readable code for estimating a most likely field map value from the set of feasible field map values for the pixel in the field map; and computer readable code for fixing a field map value of the pixel to a field map value adjacent to the estimated most likely field map value if the pixel does not satisfy the smoothness constraint with its neighboring pixels.

20. The apparatus, as recited in claim 12, wherein the computer readable code for estimating a value of the field map using a combinatorial optimization algorithm comprises:

computer readable code for minimizing a number of inconsistent pairs of field map values for neighboring pixels in the field map.

\* \* \* \* \*